(12) United States Patent
Furuhashi et al.

(10) Patent No.: US 8,772,153 B2
(45) Date of Patent: Jul. 8, 2014

(54) SEMICONDUCTOR DEVICE WITH AIR GAP THEREIN AND MANUFACTURING METHOD THEREOF

(75) Inventors: Takashi Furuhashi, Yokohama (JP);
Miyoko Shimada, Yokohama (JP);
Ichiro Mizushima, Yokohama (JP);
Shinichi Nakao, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/423,081

(22) Filed: Mar. 16, 2012

(65) Prior Publication Data

US 2013/0020706 A1    Jan. 24, 2013

(30) Foreign Application Priority Data

Jul. 19, 2011    (JP) .................................. 2011-158282

(51) Int. Cl.
| | | |
|---|---|---|
| *H01L 21/4763* | (2006.01) | |
| *H01L 21/31* | (2006.01) | |
| *H01L 23/52* | (2006.01) | |
| *H01L 21/76* | (2006.01) | |

(52) U.S. Cl.
USPC ....... 438/619; 438/622; 438/421; 257/E21.58

(58) Field of Classification Search
USPC .................. 438/453, 666–669, 98, 523, 533, 438/618–621, 672–675, 421–422; 257/773–775
See application file for complete search history.

(56) References Cited

U.S. PATENT DOCUMENTS

| | | |
|---|---|---|
| 5,407,860 A | 4/1995 | Stoltz et al. |
| 5,880,018 A | 3/1999 | Boeck et al. |
| 6,071,805 A * | 6/2000 | Liu ............................... 438/619 |
| 6,284,621 B1 * | 9/2001 | Chang et al. .................. 438/422 |
| 7,372,086 B2 | 5/2008 | Sato et al. |
| 2001/0007788 A1* | 7/2001 | Chang et al. .................. 438/421 |
| 2008/0142989 A1* | 6/2008 | Hayashi et al. ............... 257/774 |
| 2008/0265377 A1 | 10/2008 | Clevenger et al. |

FOREIGN PATENT DOCUMENTS

| | | | |
|---|---|---|---|
| JP | 2006-261440 | 9/2006 | |
| JP | 2009-295935 | 12/2009 | |
| JP | 2009295935 A * | 12/2009 | .................... 438/421 |
| JP | 2010-87159 | 4/2010 | |

OTHER PUBLICATIONS

Aw et al. ( Semiconductor Physics. Quantum Electronics & Optoelectronics. 2002. V. 5, N3. pp. 316-318.*

(Continued)

*Primary Examiner* — Steven Loke
*Assistant Examiner* — Juanita B Rhodes
(74) *Attorney, Agent, or Firm* — Finnegan, Henderson, Farabow, Garrett & Dunner, L.L.P.

(57) ABSTRACT

In accordance with an embodiment, a semiconductor device includes a substrate, a line-and-space structure, a first film and a second film. The line-and-space structure includes line patterns arranged on the substrate parallel to one another at a predetermined distance. The first film is formed on side surfaces and bottom surfaces of the line patterns by an insulating film material. The second film is formed on the line-and-space structure across a space between the line patterns by a material showing low wettability to the first film. Space between the line patterns includes an air gap in which at least a bottom surface of the first film is totally exposed.

10 Claims, 9 Drawing Sheets

(56) References Cited

OTHER PUBLICATIONS

Ibrahim, "Characterizatin of MOS structure using low-k dielectric methylsislsesquioxane with evaporated and sputtered aluminium gate", 2002, Semiconductor Physics, V. N3, pp. 316-318.*

Notification of Reason for Rejection issued by the Japanese Patent Office on Apr. 4, 2014, for Japanese Patent Application No. 2011-158282, and English-language translation thereof.

* cited by examiner

SEMICONDUCTOR DEVICE WITH AIR GAP THEREIN AND MANUFACTURING METHOD THEREOF

CROSS REFERENCE TO RELATED APPLICATIONS

This application is based upon and claims the benefit of priority from the prior Japanese Patent Application No. 2011-158282, filed on Jul. 19, 2011, the entire contents of which are incorporated herein by reference.

FIELD

Embodiments described herein relate generally to a semiconductor device and a manufacturing method thereof.

BACKGROUND

For recent shrinkage of semiconductor devices, further reduction in resistance and capacitance is required to contribute to higher speed and lower power consumption. For example, when attention is focused on the capacitance reduction, there is a pressing need to develop an interlayer insulating film with a low dielectric constant. For example, a semiconductor device having an air gap in a space between wiring lines is known as a method of reducing the dielectric constant.

As a technique for forming the air gap, a method is known which uses CVD providing low coverage in forming a coating film. However, the space between the wiring lines is entirely or partly covered even when conditions that provide low step coverage are used.

Thus, it has heretofore been not easy to form an air gap which allows the space between the wiring lines to be hardly filled with an insulating film, that is, which shows high percentage of void.

DETAILED DESCRIPTION

In accordance with an embodiment, a semiconductor device includes a substrate, a line-and-space structure, a first film and a second film. The line-and-space structure includes line patterns arranged on the substrate parallel to one another at a predetermined distance. The first film is formed on side surfaces and bottom surfaces of the line patterns by an insulating film material. The second film is formed on the line-and-space structure across a space between the line patterns by a material showing low wettability to the first film. Space between the line patterns includes an air gap in which at least a bottom surface of the first film is totally exposed.

Embodiments will now be explained with reference to the accompanying drawings. Like components are given to like reference numbers throughout the drawings to suitably omit the repetition of descriptions.

(1) Semiconductor Device According to Embodiment 1

Figure 1A:
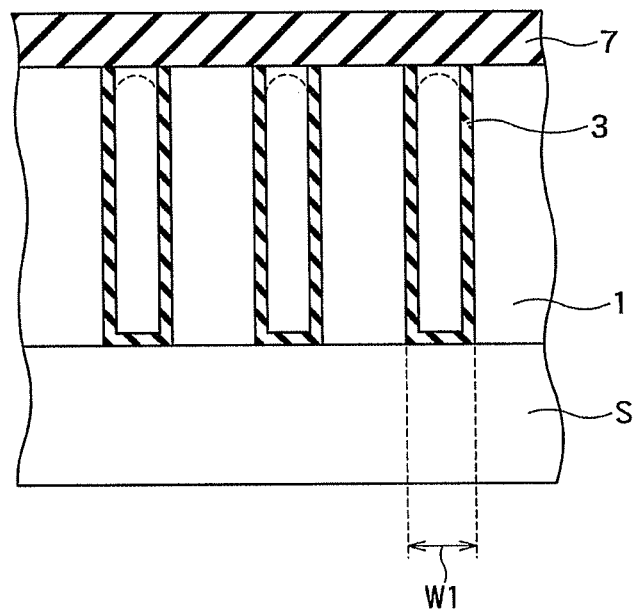
FIG. 1A is a schematic sectional view showing essential parts of a semiconductor device according to Embodiment 1.

FIG. 1A is a schematic sectional view showing essential parts of a semiconductor device according to Embodiment 1. The semiconductor device shown in FIG. 1A includes a substrate S, a line-and-space structure 1, a first insulating film 3, and a second insulating film 7.

The substrate S is a silicon substrate, and corresponds to, for example, a substrate in the present embodiment. It should be understood that the substrate S is not exclusively the silicon substrate, and may be, for example, a glass substrate or a ceramic substrate.

The line-and-space structure 1 has line patterns and space patterns alternating at a predetermined distance on the silicon substrate. The line pattern is made of a metal, and serves as a metal wiring line in the present embodiment.

The first insulating film 3 is formed by, for example, a silicon nitride film on the side surface and bottom surface of the metal wiring line of the line-and-space structure 1. The thickness of the first insulating film 3 is less than $(\frac{1}{2}) \times W1$ wherein W1 is the width of a space between metal wiring lines. In the present embodiment, the first insulating film 3 corresponds to, for example, a first film.

The second insulating film 7 is formed on the line-and-space structure 1 across the spaces of the line-and-space structure 1 by a material showing low wettability to the first insulating film 3, for example, by a silicon oxide film containing carbon such as methyl silsesquioxane (MSQ). In the present embodiment, the second insulating film 7 corresponds to, for example, a second film. According to such a structure, an air gap surrounded by the first insulating film 3 and the second insulating film 7 is formed between the metal wiring lines of the line-and-space structure 1 in the semiconductor device shown in FIG. 1A.

Figure 1B:
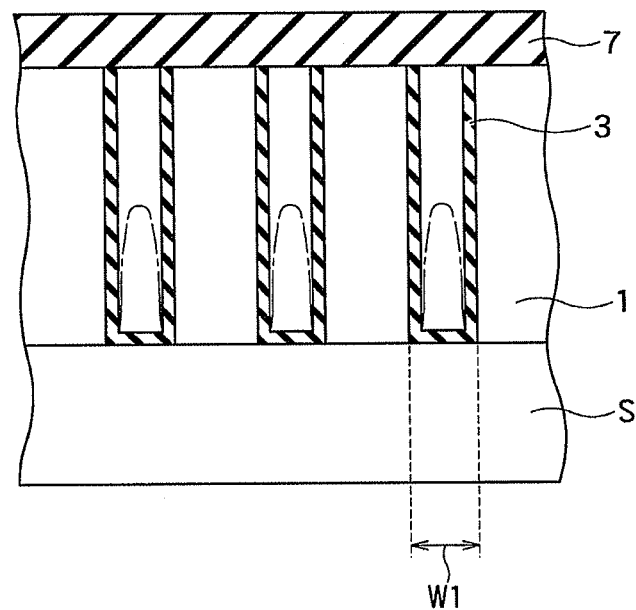
FIG. 1B is a schematic sectional view showing one modification of the semiconductor device shown in FIG. 1A.

As will be described later as an embodiment of a manufacturing method, a slight amount of MSQ which is the material of the second insulating film 7 may flow into the spaces in an actual manufacturing process. Therefore, the bottom surface of the second insulating film 7 in the space may be shaped as indicated by broken lines in FIG. 1 or may be shaped as indicated by chain lines according to a modification in FIG. 1B. However, MSQ does not flow beyond the chain lines in FIG. 1B, and at least the bottom surface of the first insulating film 3 is totally exposed. As a result, the semiconductor device according to the present embodiment has a satisfactory air gap structure. Thus, a semiconductor device with reduced capacitance is provided.

In the above explanation, MSQ which is a material with low wettability is shown as an example of the second insulating film 7. The "wettability" here can be quantitatively defined by using a contact angle. The contact angle is determined by the surface tension of a chemical or by interfacial tension between a base material and a chemical when a slight amount of chemical that allows itself to be kept isolated is dropped in forming the second insulating film 7 on the base material by the coating film forming method using a liquid raw material chemical. In general, the "wettability" can be expressed by the way in which a liquid expands when put on a solid. An angle θ at which the solid contacts the liquid is referred to as a contact angle. It is said that a smaller contact angle θ provides higher wettability and a larger contact angle θ provides lower wettability. The wettability in the present specification can be quantified from the contact angle at which a chemical containing a material for forming an insulating film is dropped on the base material to form the insulating film on the base material. In the present embodiment, the chemical containing the material of the second insulating film 7 for forming the second insulating film 7 can be quantified from the contact angle at which the chemical is dropped on the base material. In the actual measurement of the contact angle, the chemical is solidified, so that a structure in which a solid (the second insulating film 7) is formed on a solid (the first insulating film 3). However, in forming, for example, MSQ by the coating film forming method using a chemical, its wettability can be evaluated because MSQ does not greatly change in shape when solidified.

A method of manufacturing the semiconductor device shown in FIG. 1A is described with reference to FIG. 1A to FIG. 8 as a method of manufacturing the semiconductor device according to Embodiments 1 and 2.

(2) Method of Manufacturing Semiconductor Device According to Embodiment 1

FIG. 2A to FIG. 7 are schematic sectional views illustrating the method of manufacturing the semiconductor device according to Embodiment 1.

Figure 2A:
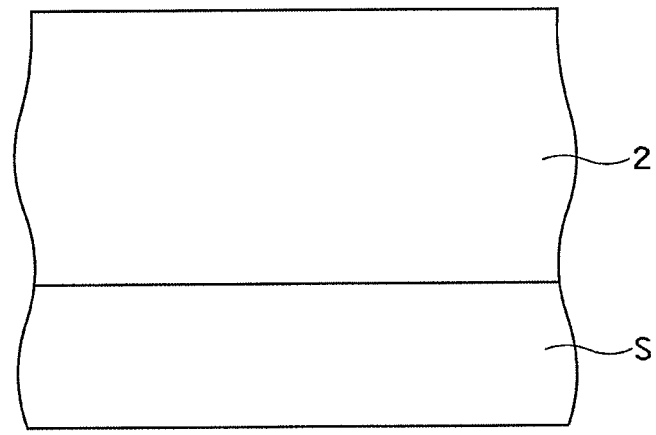
FIG. 2A to FIG. 7 are schematic sectional views illustrating a method of manufacturing the semiconductor device according to Embodiment 1.
Figure 2B:
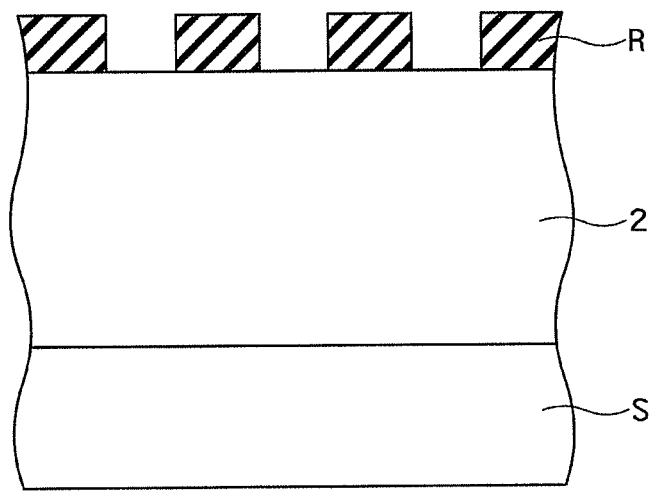
Figure 2C:
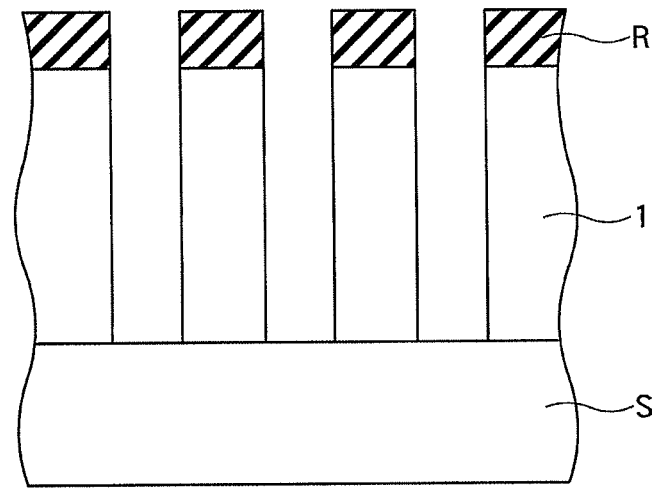
Figure 2D:
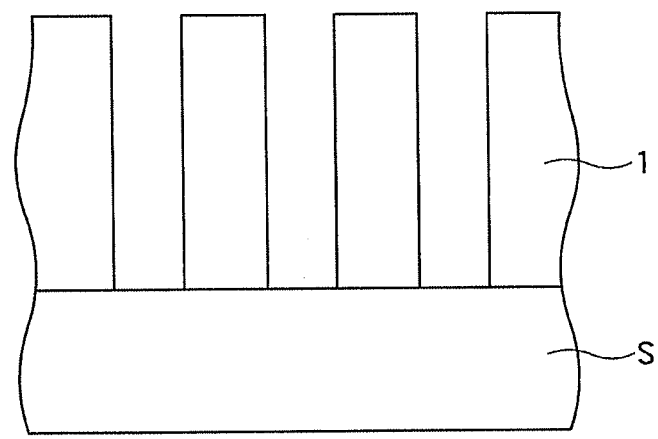

First, as shown in FIG. 2A, a metal stack film 2 is formed on a substrate S. As shown in FIG. 2B, a photoresist R is then formed. As shown in FIG. 2C, the stack film 2 is then selectively removed by dry etching. Finally, the photoresist R is removed to form a line-and-space structure 1 as shown in FIG. 2D.

Figure 3:
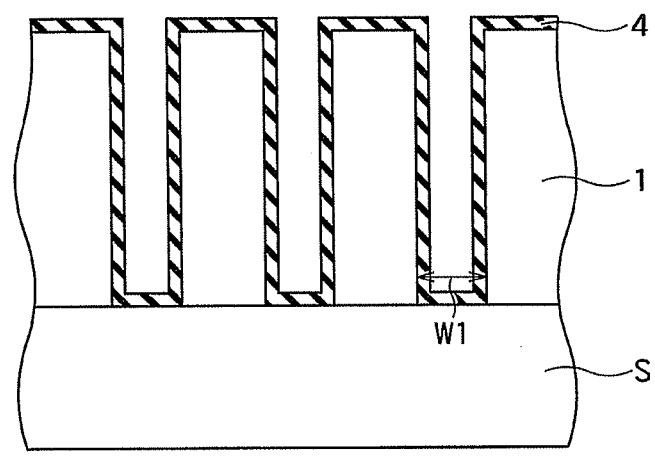

As shown in FIG. 3, a first insulating film 4 is then only formed by an insulating film material, for example, a silicon nitride film on the surface of the line-and-space structure 1 and on exposed regions of the surface of the substrate S, using, for example, a chemical vapor deposition (CVD) method. In this case, the thickness of the first insulating film 4 is less than $(½)×W1$ wherein W1 is the width of a space of the line-and-space structure 1.

Figure 4:
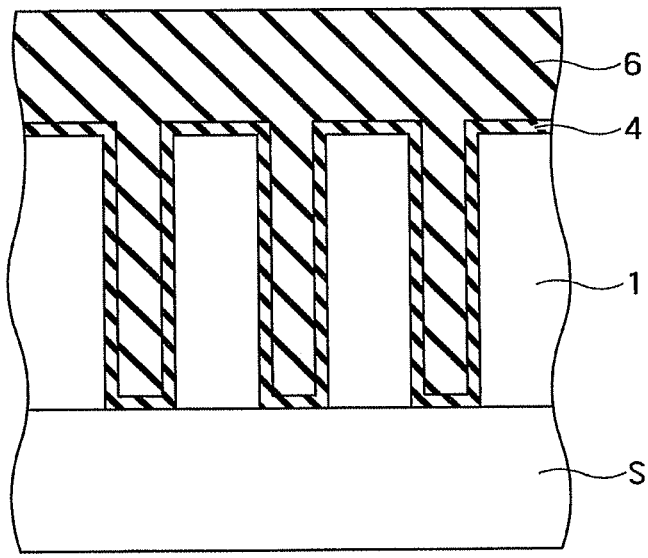

Furthermore, as shown in FIG. 4, a material which can fill the spaces and which has high wettability in regard to the first insulating film 4, for example, an amorphous silicon film or a silicon oxide film is formed as a third film 6 over the line-and-space structure 1. As a result, the third film 6 fills each space.

Figure 5:
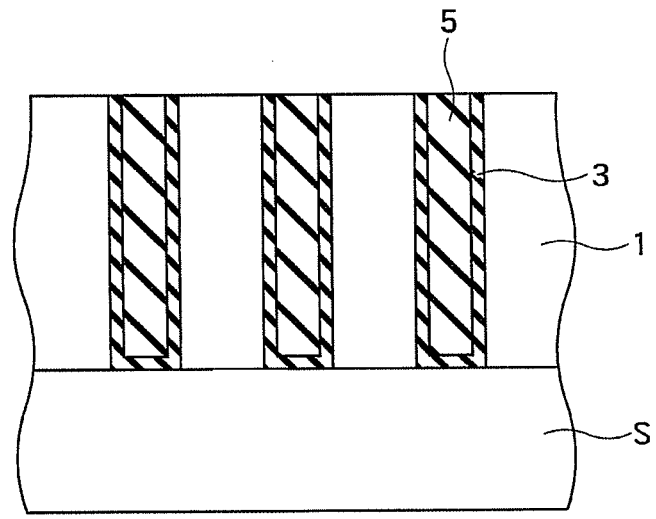

The third film 6 and parts of the first insulating film 4 formed on the lines are then removed by chemical mechanical polishing (CMP), thereby exposing the top surface of the line-and-space structure 1 as shown in FIG. 5. Thus, the first insulating film 4 and the third insulating film 6 become a first insulating film 3 and a third film 5, respectively.

Figure 6:
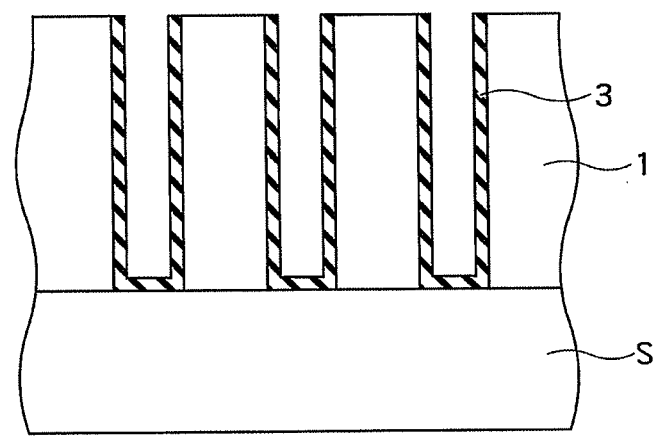

As shown in FIG. 6, the third film 5 filling the spaces is then removed by wet etching.

Figure 7:
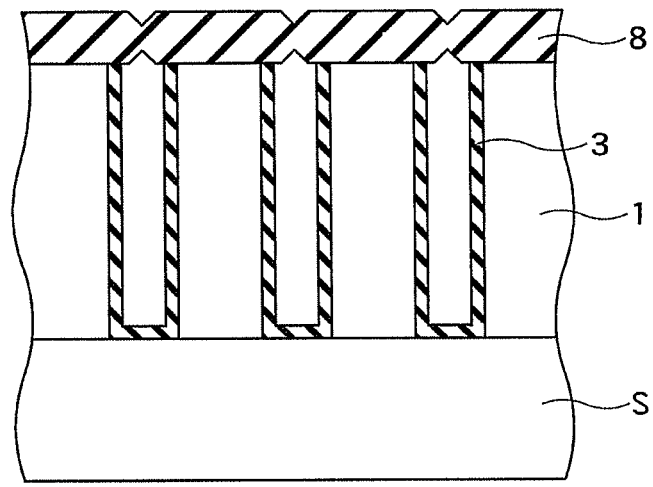

Furthermore, a second insulating film 8 is formed on the line-and-space structure 1 by the coating film forming method using a material that shows low wettability to the insulating film 3, for example, a silicon oxide film containing carbon such as MSQ. In this case, the second insulating film 8 shows low wettability to the insulating film 3 and is therefore not formed on the first insulating film 3 in the space regions. Thus, as shown in FIG. 7, the second insulating film 8 does not flow into the space regions and is formed on the tops of the lines where the first insulating film 3 is not present. As a result, the second insulating film 8 is formed across the space regions to connect the top surfaces of the line-and-space structure 1. In the present embodiment a contact angle at which a chemical containing the material of the second insulating film 8 is dropped on the foundation insulating film 3 is proved to be about 90 degrees when measured to evaluate the wettability of the second insulating film 8 in regard to the insulating film 3.

The second insulating film 8 is then hardened into a second insulating film 7 by a high-temperature heat treatment. As a result, satisfactory air gaps are formed in the spaces, that is, between metal wiring lines such that the semiconductor device shown in FIG. 1 is provided.

According to the present embodiment, the third insulating film 6 is formed by a material with high wettability in regard to the first insulating film 4 to cover the line-and-space structure 1 such that the space regions are temporarily filled with the third insulating film 6. This eliminates the concern over the collapse of patterns in the subsequent CMP process. As a result, an air gap structure can be stably formed. A contact angle at which a chemical containing the material of the third insulating film 6 is dropped on the foundation insulating film 4 is proved to be about 40 degrees when measured to evaluate the wettability of the third insulating film 6 in regard to the first insulating film 4.

(3) Method of Manufacturing Semiconductor Device According to Embodiment 2

Figure 8:
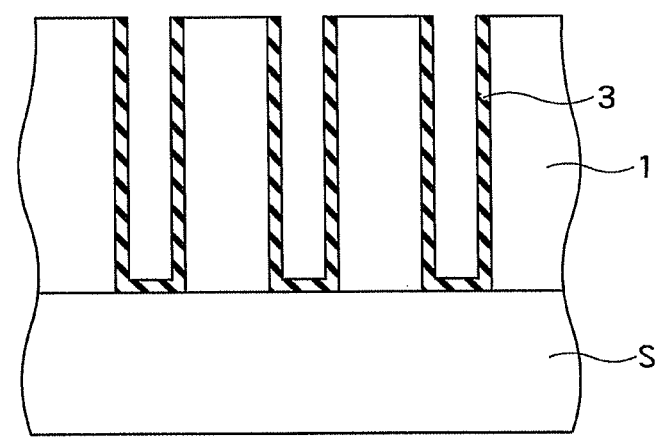
FIG. 8 is a schematic sectional view illustrating a method of manufacturing a semiconductor device according to Embodiment 2.

FIG. 8 is a schematic sectional view illustrating a method of manufacturing a semiconductor device according to Embodiment 2.

First, as in the method of manufacturing the semiconductor device according to Embodiment 1 described above, a line-and-space structure 1 is formed on a substrate S (see FIG. 2), and a first insulating film 4 is formed by an insulating film material, for example, a silicon nitride film on the surface of the line-and-space structure 1, for example, using the CVD method (see FIG. 3). In this case, the thickness of the first insulating film 4 is less than $(½)×W1$ wherein W1 is the width of a space of the line-and-space structure 1.

The first insulating film 4 formed on the top surface of the line-and-space structure 1 is then removed by CMP except in the space regions, and is thereby formed into a first insulating film 3 as shown in FIG. 8.

Furthermore, as in Embodiment 1 described above, an insulating film material that shows low wettability to the first insulating film 3, for example, a silicon oxide film containing carbon such as MSQ is formed on the line-and-space structure 1 by the coating film forming method. A second insulating film 8 that connects the top surfaces of the line-and-space structure 1 across the space regions is formed (see FIG. 7). The second insulating film 8 is then hardened into a second insulating film 7 by a high-temperature heat treatment. As a result, air gaps are formed in the space regions, that is, between metal wiring lines such that the semiconductor device shown in FIG. 1 is provided. A contact angle at which a chemical containing the material of the second insulating film 8 is dropped on the foundation first insulating film 3 is about 80 degrees.

According to the present embodiment, the second insulating film 8 is directly formed on the line-and-space structure 1 without temporarily filling the space regions with the third insulating film 6 with high wettability in regard to the first insulating film 4, in contrast with Embodiment 1 described above. Thus, a satisfactory air gap can be formed between the metal wiring lines by a smaller number of processes than in Embodiment 1.

Moreover, according to the semiconductor device manufacturing methods according to Embodiments 1 and 2 described above, a satisfactory air gap can be formed so that a silicon oxide film containing carbon such as MSQ which is a coating material does not deteriorate its original characteristics as an insulating film. Consequently, a semiconductor device which allows a lower dielectric constant and which includes an interlayer insulating film with high mechanical strength and heat resistance is provided.

(4) Semiconductor Device According to Embodiment 2

Figure 9:
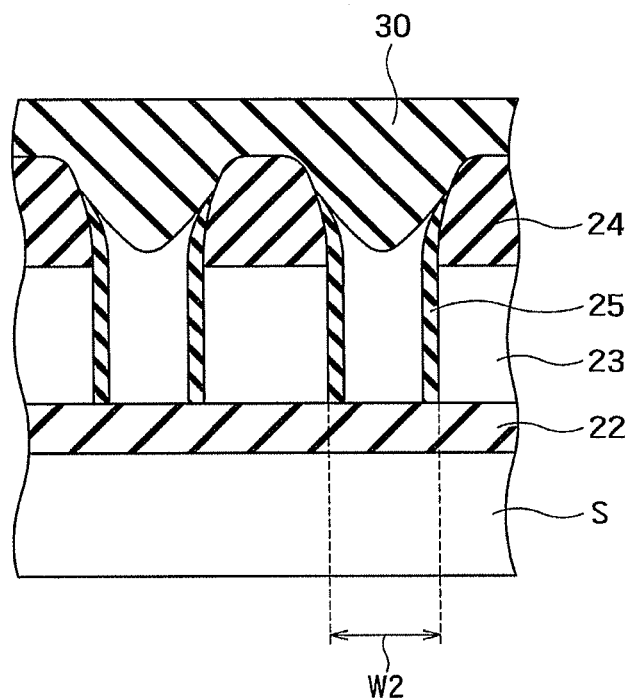
FIG. 9 is a schematic sectional view showing essential parts of the semiconductor device according to Embodiment 2.

FIG. 9 is a schematic sectional view showing essential parts of the semiconductor device according to the present embodiment. The semiconductor device shown in FIG. 9 includes a substrate S, a silicon oxide film 22, a line-and-space structure, a sidewall film 25, and an air gap formation insulating film 30.

The substrate S is a silicon substrate, and corresponds to, for example, a substrate in the present embodiment. The substrate S is not exclusively the silicon substrate, and may be, for example, a glass substrate or a ceramic substrate.

The silicon oxide film 22 is formed on the substrate S. The line-and-space structure including line patterns arranged parallel to one another at a distance W2 is formed on the silicon oxide film 22. Each of the line patterns includes a stack of a metal wiring line 23 and a plasma silicon nitride film 24 that are formed in order. A sidewall film 25 is formed on the sidewall of the line pattern, for example, by a silicon oxide film. The air gap formation insulating film 30 is formed on the line-and-space structure by a material that shows low wettability to the sidewall film 25, for example, a silicon oxide film containing carbon such as MSQ across the space regions to connect the top surfaces of the plasma silicon nitride film 24 and the sidewall film 25. At least the entire bottom surface of the space region (the upper surface of the silicon oxide film 22) is exposed. In the present embodiment, the bottom surface of the air gap formation insulating film 30 in the space region is higher than the bottom surface of the metal wiring line 23. It is particularly preferable that the bottom surface of the air gap formation insulating film 30 in the space region is higher than the top surface of the metal wiring line 23 because capacitance between metal wiring lines is further reduced accordingly. Thus, in the present embodiment, the air gap formation insulating film 30 that contributes to the capacitance between metal wiring lines is not formed on the side surface of the metal wiring line 23, so that a satisfactory air gap is formed between the line patterns. In the present embodiment, the sidewall film 25 corresponds to, for example, a first film, and the air gap formation insulating film 30 corresponds to, for example, a second film.

When the capacitance between metal wiring lines is measured in the semiconductor device shown in FIG. 9 in which the line width is 30 nm and the space width is 30 nm, it is found out that the capacitance is reduced to about 65% of the capacitance of a structure having no air gap formed therein. It is also found out that a variation is of the capacitance is less than 5% of the average value.

In the semiconductor device according to Embodiments 1 and 2 described above, a satisfactory air gap is formed in the space of the line-and-space structure, so that both the wiring resistance and capacitance are reduced, thus enabling both high speed operation and low power consumption.

In the structure shown in FIG. 9, the silicon nitride film 24 is formed on the metal wiring line 23. On the sidewall of the stack of these films, the sidewall film 25 is formed by the silicon oxide film. However, the present invention is not at all limited to the combination of these materials. Advantageous effects similar to these according to the structure in FIG. 9 can be provided if the material of the film applied to and formed on the upper surface of the line-and-space structure according to the present embodiment is different from the material formed on the side surfaces of the line patterns and if the film applied to and formed on the upper surface has low wettability in regard to the material formed on the side surfaces of the line patterns. For example, as the sidewall film, an organic material may be used or some other insulating material with a low dielectric constant may be used. In this case, the film which is formed on the metal wiring line 23 and contacts the air gap formation insulating film 30 may be some other material such as a silicon oxide film instead of the silicon nitride film 24 shown in FIG. 9.

Figure 10:
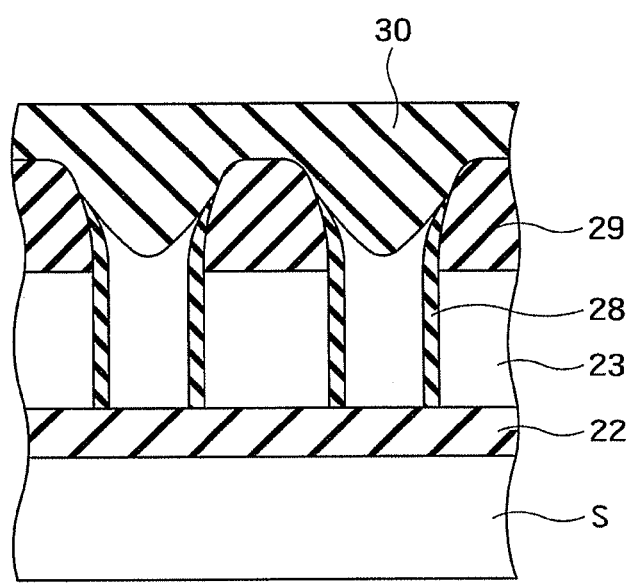
FIG. 10 is a schematic sectional view showing one modification of the semiconductor device shown in FIG. 9.

One example of such a structure is shown in FIG. 10 as a modification of the present embodiment. Regarding a sidewall film 28 of a semiconductor device shown in FIG. 10, the concentration of carbon (C) contained in a silicon oxide film is 5% or more. A silicon oxide film 29 is formed on the metal wiring line 23, and the top surface of the silicon oxide film 29 contacts the air gap formation insulating film 30.

As the material containing carbon (C) or the material with a low dielectric constant is used as the sidewall film, a satisfactory air gap is formed due to the low wettability of these materials. Moreover, the relative dielectric constant of these materials is about 2.5 to 3.5, which is lower than 4.2 in the silicon oxide film or 7.5 in the silicon nitride film. Thus, the capacitance between metal wiring lines can be further reduced.

(5) Method of Manufacturing Semiconductor Device According to Embodiment 3

Figure 11:
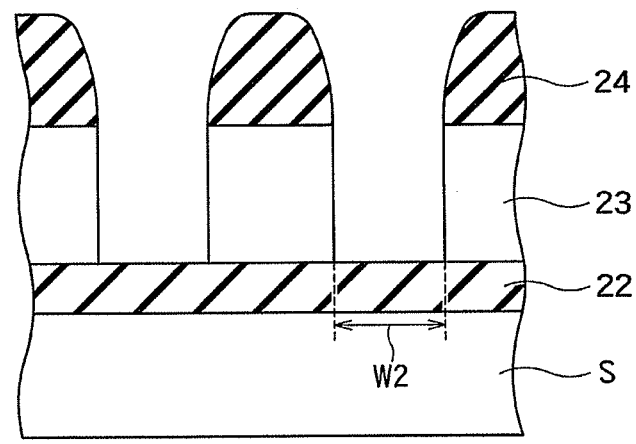
FIG. 11 to FIG. 13 are schematic sectional views illustrating a method of manufacturing a semiconductor device according to Embodiment 3.
Figure 12:
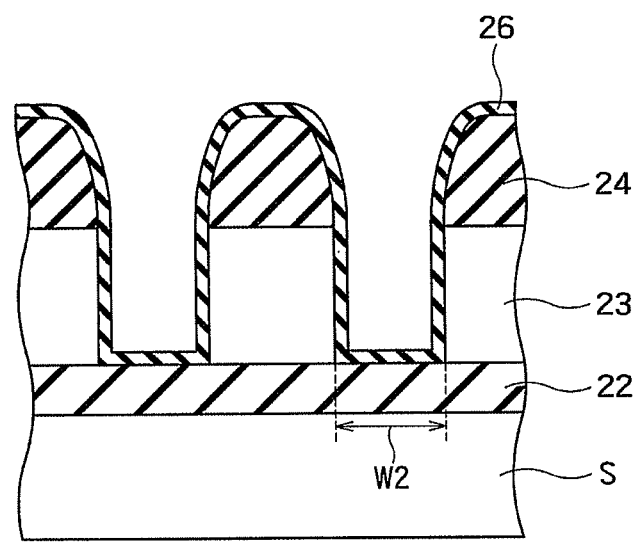
Figure 13:
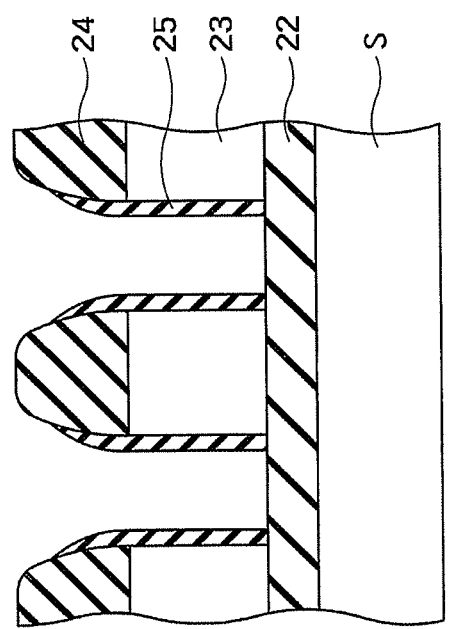

A method of manufacturing the semiconductor device shown in FIG. 9 is described as a method of manufacturing the semiconductor device according to Embodiment 3. FIG. 11 to FIG. 13 are schematic sectional views illustrating the method of manufacturing the semiconductor device according to the present embodiment.

First, a silicon oxide film 22 is formed on a substrate S, and then a metal and a plasma silicon oxide film 23 are stacked on the silicon oxide film 22. Furthermore, an unshown photoresist is formed and subjected to known dry etching to selectively remove the stack. Finally, the photoresist is removed to form a line-and-space structure in which line patterns including the metal wiring line 23 and a plasma silicon nitride film 24 are arranged parallel to one another at a predetermined distance W2, as shown in FIG. 11. In the present embodiment, the plasma silicon nitride film 24 corresponds to, for example, a first insulating film, and silicon oxide film 22 corresponds to, for example, a second insulating film.

In this case, the shoulder of the silicon nitride film 24 has a slightly sloping shape because the resist is etched when the silicon nitride film 24 and the metal wiring line 23 are etched for fabrication. In the present embodiment, both the width of the metal wiring line 23 and the width W2 of the space between the metal wiring lines 23 are, for example, 25 nm. The material of the metal wiring line 23 is, for example, tungsten (W), and the thickness of the metal wiring line 23 is 100 nm. The silicon nitride film thereon has a thickness of 75 nm.

As shown in FIG. 12, a silicon oxide film 26 is then formed by atomic layer deposition (ALD)-CVD to cover the side surface of the metal wiring line 23. In the present embodiment, the thickness of the silicon oxide film 26 is, for example, 4 nm. This thickness is preferably less than half of the space width W2 to leave a clearance as an air gap in the subsequent process. On the other hand, the thickness of the silicon oxide film 26 needs to be such that the silicon oxide film 26 does not disappear in fabrication by the subsequent process, specifically, needs to be about 2 nm or more.

Dry etching is then conducted so as to leave the part of the silicon oxide film 26 that is formed on the side surface of the metal wiring line 23, thereby forming a sidewall film 25 as shown in FIG. 13. This can be formed by known anisotropic dry etching. In the example shown in FIG. 13, the thickness of the sidewall film 25 is also preferably less than half of the space width W2.

Furthermore, as in Embodiments 1 and 2 described above, a material that shows low wettability to the sidewall film 25, for example, a silicon oxide film containing carbon such as MSQ is applied to the line-and-space structure and then hardened into an air gap formation insulating film 30 by a high-temperature heat treatment. The air gap formation insulating film 30 is only formed on the top surface of the plasma silicon nitride film 24 and the upper end of the sidewall film 25 without entering the space regions due to the low wettability in regard to the sidewall film 25. As a result, an air gap structure shown in FIG. 9 is provided. A contact angle at which a chemical containing the material of the air gap formation insulating film 30 is dropped on the foundation sidewall film 25 is proved to be about 65 degrees.

Instead of the sidewall film 25, a silicon oxide film with a C concentration of 5% or more may be used as the sidewall film 28. In this case, capacitance between metal wiring lines can be further reduced.

Thus, in accordance with the present embodiment, an air gap structure with reduced characteristic variations can be stably formed.

In the embodiments described above, the air gap structure is formed in the line-and-space structure. However, the present invention is not limited thereto, and is also applicable to a trench structure so that a similar air gap structure can be provided.

When an insulating film is formed by the coating film forming method, the wettability of this film varies depending on the base material and the coating material. However, an air gap structure that reflects the spirit of the present invention can be formed with a contact angle of about 60 degrees or more when the insulating film is formed to have low wettability as a feature or with a contact angle of about 45 degrees or less when the insulating film is formed to have high wettability as a feature.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device manufacturing method comprising:
    forming a line-and-space structure on a substrate;
    forming a first film on a sidewall and upper surface of a line of the line-and-space structure by an insulating film material to have a thickness less than half of a width of a space;
    selectively removing the first film to expose a top surface of the line while having the first film remain on the sidewall;
    covering the line-and-space structure by a coating film forming method with a material showing low wettability to the first film to form a second film which extends across the line-and-space structure and is in direct contact with the entire to surface of the line; and
    hardening the second film by a heat treatment.

2. The method of claim 1, further comprising
    filling the space with a material showing high wettability to the first film to form a third film before selectively removing the first film; and
    removing the third film before forming the second film,
    wherein the top surface of the line-and-space structure is exposed by selectively removing the first film after the third film is removed.

3. The method of claim 2,
    wherein a part of the third film on the line-and-space structure is selectively removed before the formation of the second film, and
    a rest of the third film is removed after the top surface of the line-and-space structure is exposed.

4. The method of claim 1,
    wherein a contact angle between the low-wettability material and the first film substantially ranges from 60 degrees to 90 degrees.

5. The method of claim 2,
    wherein a contact angle between the third film and the first film substantially ranges from 40 degrees to 45 degrees.

6. The method of claim 1,
    wherein the first film is formed by an organic film, an insulating film containing carbon, or a material with a low dielectric constant.

7. The method of claim 6,
    wherein a relative dielectric constant of the low-dielectric-constant material substantially ranges from 2.5 to 3.5.

8. The method of claim 1,
    wherein the first film is an MSQ film.

9. The method of claim 1,
    wherein a line pattern of the line-and-space structure comprises a metal wiring line, and a first insulating film on the metal wiring line.

10. The method of claim 9,
    further comprising forming a second insulating film between the substrate and the line-and-space structure.

* * * * *